United States Patent [19]

Lange

[11] Patent Number: 4,691,143
[45] Date of Patent: Sep. 1, 1987

[54] CIRCUIT STATUS INDICATING DEVICE WITH IMPROVED SWITCH ON/OFF DETECTION CAPABILITY

[75] Inventor: Philip E. Lange, Dayton, Ohio

[73] Assignee: Aero-Metric General, Inc., Dayton, Ohio

[21] Appl. No.: 904,387

[22] Filed: Sep. 5, 1986

[51] Int. Cl.⁴ .............................................. H01J 1/60
[52] U.S. Cl. .................................... 315/133; 315/131; 315/194; 315/307; 340/644
[58] Field of Search ............... 315/307, 131, 133, 194; 340/644

[56] References Cited

U.S. PATENT DOCUMENTS

| | | | |
|---|---|---|---|
| 3,136,920 | 6/1964 | Jensen | 315/131 |
| 4,211,956 | 7/1980 | Bloyd | 315/199 |
| 4,342,947 | 8/1982 | Bloyd | 315/199 |
| 4,484,180 | 11/1984 | DeForeit | 340/644 |

Primary Examiner—Harold Dixon
Attorney, Agent, or Firm—Jacox & Meckstroth

[57] ABSTRACT

A circuit status indicating device is used to monitor separate circuits to indicate their on/off status. Each circuit conducts an AC operating signal when switched to "on" status and an AC non-operating signal when switched to "off" status. The AC non-operating signal can be zero or some fraction of the AC operating signal, depending on the type of contact switches used in the circuit being monitored. A separate LED is provided for each circuit monitored. A separate AC input signal corresponding to one of the AC operating and non-operating signals in each monitored circuit is received and compared with a modified AC reference signal to produce an AC comparison output signal. A DC reference signal is compared with the AC comparison output signal and produces a DC output signal when the AC comparison output signal exceeds the DC reference signal. The AC comparison output signal is above the DC reference signal when, after brief delay of some input cycle periods or fraction thereof, it corresponds to the AC operating signal and is below the DC reference signal when it corresponds to the AC non-operating signal. The DC output signal operates the corresponding LED from "off" to "on" condition. In absence of the DC output signal, the LED is operated from "on" to "off" condition.

18 Claims, 4 Drawing Figures

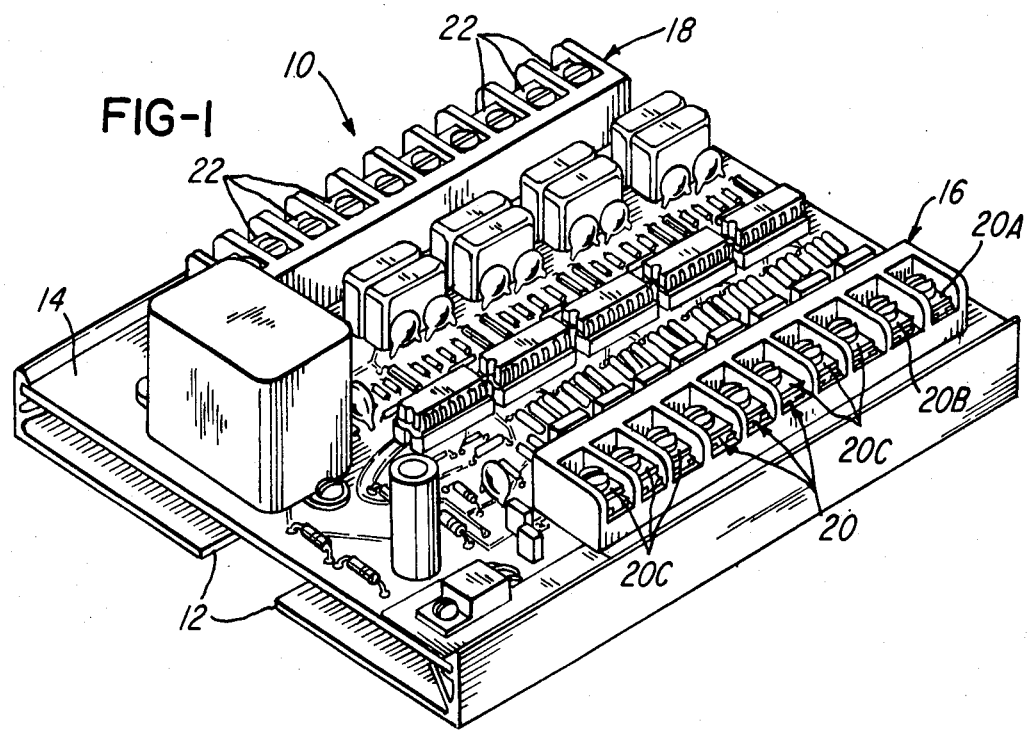
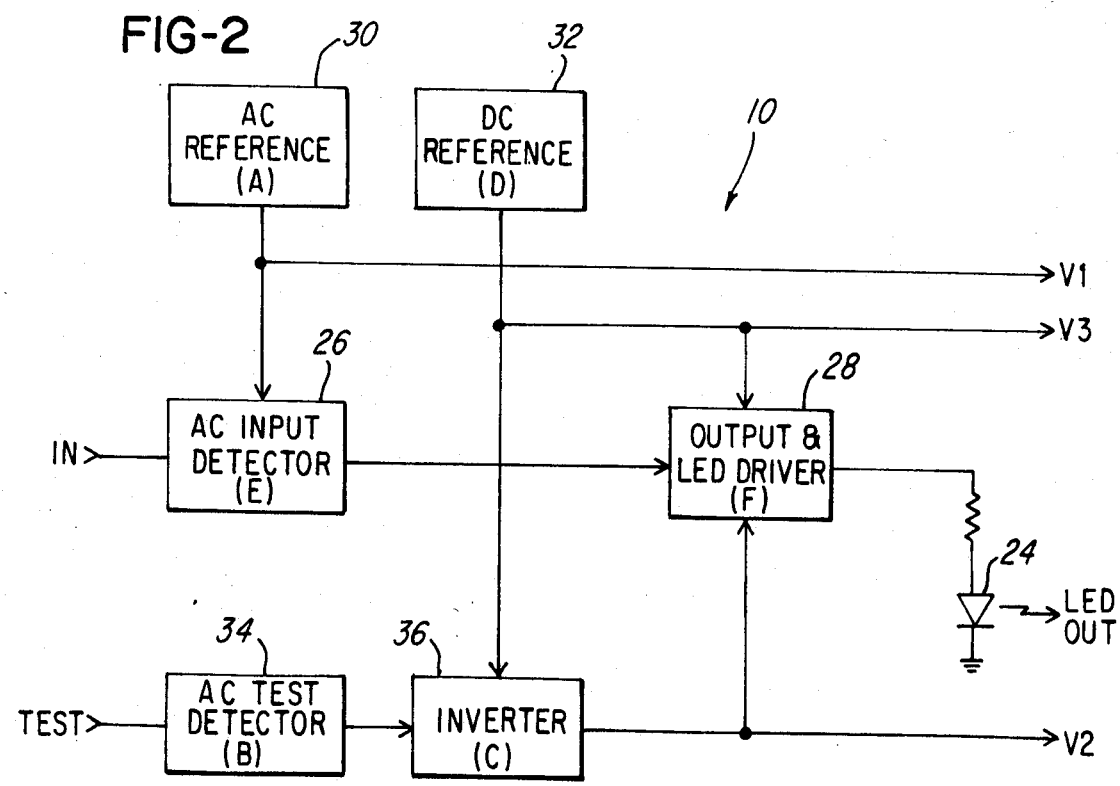

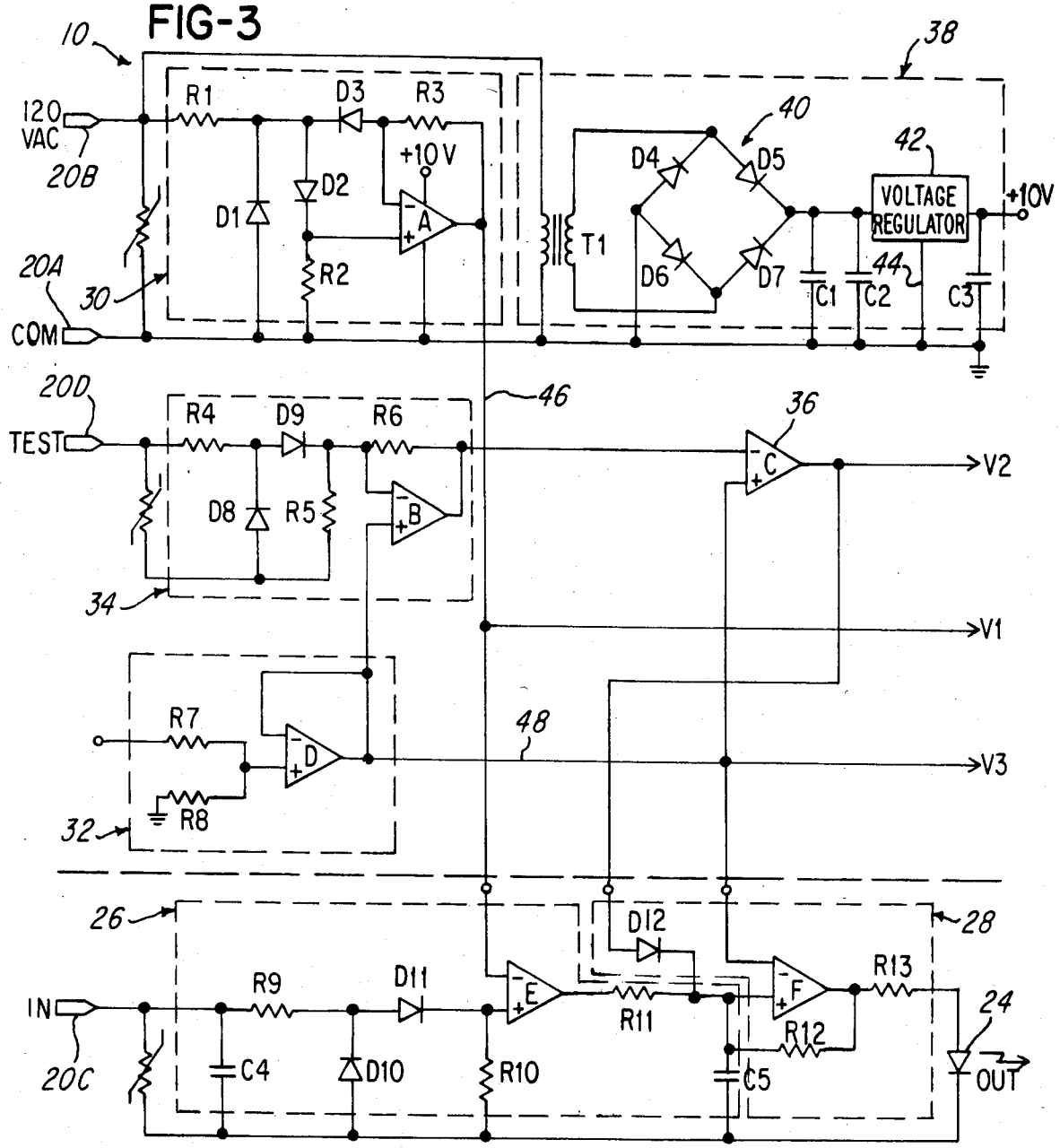
FIG-3
FIG-4 MODIFIED AC REFERENCE SIGNAL

CIRCUIT STATUS INDICATING DEVICE WITH IMPROVED SWITCH ON/OFF DETECTION CAPABILITY

BACKGROUND OF THE INVENTION

It is known to provide a plurality of light emitting diodes (LED's) to visually indicate, by "on" or "off" conditions of the LED's, the status of various operating components of a system, such as machine functions. For example, each LED can represent a cam position, a relay contact closure, a temperature limit, and any other physical or electrical parameter used in machine control systems, typically, each LED is connected in a circuit interfaced with a control circuit which either electrically operates or monitors the particular machine function. Monitoring the operational state of the machine function is accomplished by detecting the "on" or "off" status of the control circuit associated with it.

One commercially-successful circuit status indicating device useful for monitoring equipment during operation, and also adapted for other applications as well, is disclosed in U.S. Pat. Nos. 4,211,956 and 4,342,947. In order to interface with machine control circuits operated at conventional AC voltage levels, for instance, of 120 volts AC, this device employs a phase controlled silicon controlled rectifier (SCR) circuit connected to LED's so as to substantially reduce the electrical power and heat generation in the system. Specifically, the SCR circuit limits conduction of rectified AC energy through the LED's and through corresponding current limiting resistors connected in series with the LED's for limiting the current through the LED's. The SCR circuit thereby operates low DC voltage LED's from high AC voltage sources, i.e. the monitored machine control circuits, with a minimum of power and heat generation in the current limiting resistors.

The patented circuit status indicating device works satisfactorily when interfaced with machine control circuits through so-called "hard" contact switches, such as relay contacts, that are non-conducting when in an "off" status. However, the current trend in machine control technology is toward use of programmable controllers and proximity detectors which utilize solid-state switches, such as triacs, in their outputs. These so-called "soft" contact switches commonly employ a series resistor/capacitor network, a so-called snubber circuit, in parallel with their triacs for transient protection. Such snubber circuit continues to conduct some fraction of the current of the machine control circuit even when it is in an "off" status. As a consequence, the circuit status indicating device of the aforesaid patents is unable to switch its respective output LED completely off, preventing an operator from using the indicating device to ascertain the correct operational status of the machine function being monitored.

SUMMARY OF THE INVENTION

The present invention is directed to an improved circuit status indicating device with the capability of detecting on/off conditions of machine control circuits and the like employing either "hard" or "soft" contact switches. Therefore, the improved circuit status indicating device is useful in monitoring any AC circuit to indicate its on/off status. Particularly, the improved indicating device is especially adapted to monitor an AC circuit wherein the circuit conducts an alternating current (AC) operating signal when switched to "on" status and an AC non-operating signal when switched to "off" status, with AC non-operating signal being at a maximum only a franctional portion of the AC operating signal.

Basically, the circuit status indicating device comprises: indicating means operated from an "off" to "on" condition by a direct current (DC) signal and from the "on" to "off" condition by the absence of a DC signal; means for receiving an AC input signal, the AC input signal corresponding to one of the AC operating and non-operating signals being conducted in the circuit being monitored; means for generating a modified AC reference signal; means for comparing the AC input signal with the modified AC reference signal and producing an AC comparison output signal, the AC comparison output signal being a first AC output signal when the AC input signal corresponds to the AC operating signal and a second AC output signal when the AC input signal corresponds to the AC non-operating signal; means for generating a DC reference signal above a predetermined level to operate the indicating means in the "on" condition; means for comparing the AC comparison output signal with the DC reference signal and producing a DC output signal when the AC comparison output signal exceeds the predetermined level of the DC reference signal, the AC comparison output signal when corresponding to the first AC output signal being above the level of the DC reference signal and when corresponding to the second AC output signal being below the level of the DC reference signal; and means for receiving the DC output signal and operating the indicating means from the "off" to "on" condition, and from the "on" to "off" condition in absence of receipt of the DC output signal.

BRIEF DESCRIPTION OF THE DRAWING

FIG. 1 is a perspective view of an improved circuit status indicating device constructed in accordance with the invention;

FIG. 2 is a block diagram of the improved indicating device without the power supply and with only one output LED and its associated AC input detector and LED driver being illustrated;

FIG. 3 is a schematic circuit diagram of the improved indicating device illustrating in detail the makeup of the components of the circuit represented by the block diagram of FIG. 2 plus the power supply; and FIG. 4 is a diagram of a waveform produced by an AC reference component of the circuit of the improved indicating device.

DESCRIPTION OF THE PREFERRED EMBODIMENT

Referring to the drawing, FIG. 1 shows an improved circuit status indicating device 10 which is typically used for monitoring voltages throughout an electrical or electronic apparatus or system, for example, during initial setup and debugging of automatic assembly equipment and/or for monitoring the equipment during operation to assure that various electrically controlled devices are each receiving electrical energy at the proper time. The indicating device 10 has the same capability of monitoring the on/off status of machine control circuits employing "hard" contact switches, as that of the indicating device of the aforesaid patents. In addition whereto, the device 10 has an expanded capability, beyond that of the patented device, of monitoring on/off status of machine control circuits employing "soft" contact switches. Thus, the improved indicating device 10 is particularly adapted to monitor the on/off status of machine control circuits incorporating programmable controllers or proximity detectors which utilize solid-state switching devices, such as triacs, the snubbers of which continue to conduct currents even when in the "off" state.

The indicating device 10 incorporates a rectangular plastic track or base 12 into which is inserted a printed circuit board 14. A pair of elongated terminal blocks 16 and 18 are mounted along opposing longitudinal edges of the board 14 and include respective rows of screw terminals 20 and 22. The lower row of screw terminals 20 are adapted to be connected to corresponding electrically operated or monitored components of the equipment (not shown) which is to be monitored by the indicating device 10. The upper row of screw terminals 22 are adapted to be connected to LED's 24 (one of which is shown in FIGS. 2 and 3) which correspond to the equipment components. The two of the terminals 20 at the far right of the lower row thereof of the terminal block 16 provide for connecting the AC power (hot) input conductor and AC input common, whereas the two of the terminals 22 at the far right of the upper row thereof of the terminal block 18 provide for connecting the LED common and test input conductor Therefore, as briefly mentioned above, primarily the indicating device 10 is useful in monitoring a circuit to indicate its on/off status. The monitored circuit (not shown) is the type which conducts an alternating current (AC) operating signal when switched to "on" status and an AC non-operating signal when switched to "off" status. The AC non-operating signal is either practically zero or, at a maximum, is only a fractional portion of the AC operating signal. In the case where the circuit employs "hard" contact switched the AC non-operating signal is essentially non-existant and thus zero, whereas in the case where the circuit employs "soft" contact switches the AC non-operating signal is reduced by about twenty percent or more from the AC operating signal when only loaded by connection to the indicating device. For example, if the "soft" or solid-state switch is a triac associated with a 0.01 Mfd protective snubber capacitor, in the "off" status the AC non-operating signal is reduced by about 25 VAC from the AC operating signal of 120 VAC.

Referring to FIG. 2, there is shown a block diagram of the improved circuit status indicating device 10 with only one LED 24 being shown at its output. Both of the blocks 26 and 28 captioned AC input Detector and Output & LED Driver relate to circuitry associated with each LED 24 of the device. Any number of detectors 26, drivers 28 and LED's 24 can be provided; for instance, one device might have a set of eight and another device a set of sixteen in order to cover the needs of most customers. None of the other blocks are repeated in a given device 10. The block 30 captioned AC Reference relates to circuitry which generates and feeds a modified AC reference signal to all the detectors 26 through V1, the block 32 captioned DC Reference relates to circuitry which generates and feeds a DC reference signal to all the drivers 28 through V3 and the block 34 captioned AC Test Detector via a block 36 captioned Inverter relates to circuitry which feeds all the drivers 28 through V2.

Generally speaking, each AC input detector 26 monitors a respective external circuit and is sensitive to both amplitude and phase changes in the signal of the monitored circuit. Specifically, the signal of the external circuit is determined to be "on", or an AC operating signal, when the AC input signal after input conditioning is both (1) in phase with the AC reference signal on V1, and (2) greater in amplitude than the AC reference signal. When the AC input signal corresponds to the "on" or AC operating signal, the AC comparison output signal of the detector 26 is a signal which constantly ramps up and down, the average positive and negative going peaks of which lie above the DC reference signal of V3 and is used as a switching threshold for the following stage, which is circuitry of the Output and LED Driver block 28. The latter stage supplies the latching mechanism of hystersis to assure constant output drive voltage as well as a minimum current capability, such as twenty milliamperes, for the corresponding one of the LED's 24.

When an AC signal, such as 120 VAC line signal, is applied to circuitry of the AC Test Detector block 34, it produces a square wave at the line rate at its output. After the following inversion by circuitry of the Inverter block 36, it drives all drivers 28 at the LED output stages to switch all LED's 24 to "on" condition. (The inverter 36 is required for the sake of correct DC logic when the input to the test detector 34 is "off". At this time, the output of the test detector 34 is high but a low input to all LED output stages is required to switch all LED's 24 to "off" condition.)

In FIG. 3, a preferred embodiment of the circuit of the indicating device 10 is illustrated in detail, with the components below the dashed line—circuitry of the input detector 26 and of LED driver 28—being repeated for each LED 24 being driven. In addition to the circuitry of the respective blocks of FIG. 2 being illustrated in detail, a power supply 38 is also shown in FIG. 3.

The power supply 38 includes a step-down transformer 11 which feeds a bridge rectifier 40, being composed of diodes D4, D5, D6 and D7, and then a three-terminal voltage regulator 42, for instance, one with a ten volt output. The voltage regulator 42 has either a 500 Mfd (for eight LED's) or a 1000 Mfd (of sixteen LED's) capacitor input filter C1 and noise-oscillation suppressing capacitors C2 and C3 of 0.1 Mfd respectively at the input and output of the voltage regulator. The ground lead 44 of the voltage regulator 42 is connected to the AC common input terminal 20A. (This satisfies the necessity of having not only a single-ended output at operational amplifiers—op-amps—in the various components to be described hereinafter, but also single-ended processing of the AC input signals by the op-amps.) The output of positive 10 volts DC of the voltage regulator 42 supplies all of the remaining circuitry of the device 10 as well as the current for all external LED's 24.

The AC reference signal generator, being composed of the components enclosed within the dashed box designated as 30, receives a 120 VAC line signal at terminal 20B and generates at the output of an op-amp A lead line 46 a modified AC reference signal, shown in FIG. 4, composed a series of positive square waves alternating with a series of positive sine waves. This waveform is generated by operating the op-amp A as a unity gain, non-inverting amplifier during positive input half-cycles and alternating as a greater-than-unity gain, saturating inverter during negative input half-cycles. During positive half-cycles, the sine wave is divided by resistors R1 and R2 through diode D2 and applied to the non-inverting input of the op-amp A. The undivided feed-back through resistor R3 maintains unity gain and maintains a reverse bias on diode D3, equal but opposite the forward junction voltage of diode D2. During negative half-cycles, the diode D2 is switched out because its cathode is clamped to slightly below ground by D1. The resistor R2 develops a slightly positive voltage owing the base-emitter current of the internal PNP transistor (not shown) at the non-inverting input of the op-amp A. However, the inverting input current is sunk through resistor R3. This input is slightly below ground because the forward drop of diode D3 is less than that of diode D1 owing to the differences in current. The open loop gain thereby provides the square wave.

The AC input detector, being composed of the components within the dashed box designated as 26, provides the means for receiving an AC input signal on one of the AC input terminals 20C as well as the means for comparing the AC input signal with the modified AC reference signal received on lead line 46 from the op-amp A of the AC reference signal generator 30. Each AC input signal corresponds to one of the AC operating and non-operating signals being conducted in one of the external circuits being monitored by the device 10. Further, the AC input detector 26, as will become clear later on, provides the means for producing an AC comparison output signal. The AC comparison output signal is either an AC output signal which corresponds to the AC operating signal or an AC output signal which corresponds to the AC non-operating signal of the monitored external circuit.

More particularly, the AC input detector 26 is generally made up of the circuitry associated with an op-amp E, although the output of this stage is taken at the junction of resistor R11 and capacitor C5. The non-inverting input of the op-amp E is fed by a voltage divider made up of resistors R9 and R10 which are similar to the voltage divider of the AC reference signal generator 30 (e.g. resistors R1 and R2), but have a ratio nearly twenty percent greater than the other divider. This assures that when the AC input signal is "on" or an operating signal, and thus equal in amplitude and phase during positive half-cycles to that of the 120 VAC line signal, the output of the op-amp E will be "on" (i.e., near the supply voltage of ten volts) which charges capacitor C5 through resistor R11. In view of the higher ratio of the voltage divider feeding the op-amp E of the AC input detector 26 than the divider feeding the op-amp A of the AC reference signal generator, the non-inverting input signal of the op-amp E is greater than the modified AC reference signal over the complete positive half-cycle of the sine wave and therefore the op-amp E is "on" For a half-cycle period only.

During the negative half-cycle of the sine wave, diode D11 is switched out and resistor R10 develops a slightly positive voltage (much less than one volt) at the non-inverting input of the op-amp E. However, the modified AC reference signal supplied to the inverting input of the op-amp E is a high level (near supply voltage of ten volts) square wave during this time and assures that the output of op-amp E will be "off" (near ground). This results in a discharge of capacitor C5 for the entire duration of the negative half-cycle. It should be noted, therefore, that under the input condition assumed, that is, the presence of an AC operating signal of 120 VAC in the monitored circuit, the output of op-amp E will be square wave of fifty percent duty cycle over each input full cycle (which will be true whether the contact switches closed in the external circuit being monitored are "hard" or "soft"). Capacitor C5 would then eventually, in the absence of resistor R12 associated with the op-amp F of the driver 28 and after the first few "on" cycles, charge and discharge about a point roughly equal to one-half of the supply voltage of ten volts, or approximately about a point equal to five volts, which is not a desirable mode of operation as will become clear below.

The DC reference generator is composed of the components in the dashed box designated as 32. Specifically, the DC reference signal is derived by a voltage divider formed by resistors R7 and R8. A unity gain op-amp D buffers the DC reference signal which appears on output lead line 48 and is fed to each LED driver 28. The DC reference signal is approximately equal to one-third of the supply voltage of ten volts.

The LED driver, being composed of the components within the dashed box designated as 28, provides the means for comparing the AC comparison output signal produced by the AC input detector 26 with the DC reference signal produced by the DC reference signal generator 32 and producing a DC output signal when the AC comparison output signal exceeds the predetermined level of the DC reference signal. The driver 28 also provides the means for receiving the DC output signal and operating indicating means in the form of one of the plurality of LED's 24 from an "off" to "on" condition. If no DC output signal is produced, then the driver 28 operates the LED 24 from its "on" to "off" condition. It will be seen that, after brief delay of some input cycle periods or fraction thereof, the AC comparison output signal corresponds to the AC operating signal of the monitored circuit, and is above the level of the DC reference signal; on the other hand, when it corresponds to the AC non-operating signal, it is below the level of the DC reference signal.

More particularly, each LED driver 28 is generally made up of circuitry associated with an op-amp F which drives each external LED 24 through a current limiting resistor R13. The DC reference signal, roughly equal to one-third the supply voltage of ten volts, is applied to the inverting input of the op-amp F. The non-inverting input of the op-amp F is connected to receive the AC comparison output signal of the AC input detector 26. As mentioned earlier, capacitor C5, which modifies the AC comparison output signal to the input of op-amp F, would charge and discharge about a point equal to one-half the supply voltage, if the resistor R12 associated with the op-amp F of the driver 28 were not present. Thus, the output of the op-amp F would go "on" whenever capacitor C5 charges beyond the level of the DC reference signal. This would give an erratic, less than continuous "on" or lit condition of the LED 24 due to the capacitor's charge and discharge behavior and its voltage repetitively crossing the DC reference signal level in both directions.

This problem is relieved by the addition of the hysteresis feedback through resistor R12. It has a value approximately five times greater than R11 and has the effect of reducing the switching threshold established by the DC reference signal when op-amp F's output is low and of increasing that threshold when op-amp F's output is high. It then raises or lowers the average point about which capacitor C5 charges and discharges. It, in fact, raises the effective switching threshold reference so that negative going discharges of capacitor C5 do not deviate below the threshold. The result is that the respective LED 24 is continuously, rather than intermittantly "on" or lit during the interval when it should be "on" (i.e. when a 120 VAC operating signal is applied to the AC input terminal 20C of the AC input detector 26).

When the AC input signal from an external "hard" contact switch in the monitored circuit is "off" (i.e., the status of the monitored circuit is "off"), the output of the op-amp E remains "off", the voltage on capacitor C5 never rises above ground, and the output on the op-amp F and the LED 24 remain "off". However, an "off" input from a solid-state or "soft" contact switch is an entirely different matter owing to the presence of its snubber capacitor, typically 0.01 Mfd., which passes an AC non-operating signal (voltage and current) to the input terminal 20C of the AC input detector 26, which signal is a fraction of the 120 VAC operating signal.

The input capacitor C4 of the AC input detector 26 is about five times larger than the snubber capacitor (not shown) and therefore delivers a greatly reduced in-phase, AC signal to the voltage divider formed by resistors R9 and R10. However, this divider is only about twice the snubber capacitor/capacitor C4 impedance and therefore shifts the phase of the divided signal appearing at resistor R10. Both the reduced amplitude and the phase change, compared to the modified AC reference signal, assure that the AC comparison output signal of the op-amp E will be so reduced from the fifty percent duty cycle that the most positive excursion of a charging capacitor C5 will never cross the DC threshold reference signal in the output driver stage of the device 10.

The above mentioned conversion from a pulse train of varying duty cycle to switched levels driving LED on/off states will be recognized as a method of pulse width detection in current state of the art, but uniquely applied here to resolve the unusual problems inherent in the on/off states of traic/snubber-circuit configurations.

Finally, the AC test detector is generally composed of the components enclosed by dashed box 34. The test function of the device 10 is accomplished with op-amps B and C and their associated circuitry of the test detector 34 and a diode D12 which is contained within the circuitry of each LED output driver 28. The purpose of the aforementioned components is to drive the anode of the diode D12 to near the level of the supply voltage (ten volts) a large fraction of the time (forty percent is adequate). This forces the voltage on capacitor C5 beyond the level of the DC reference signal so that the output LED 24 is "on" or lit for the duration of the test function (i.e. for as long as it is held operative).

The input circuitry of the op-amp B of the AC test detector 34, being connected to a 120 VAC line signal at Test terminal 20D, is similar to that of the AC input detector 26 except that the output of the voltage divider formed by resistors R4 and R5 is fed to the op-amp B's inverting input. Also, resistor R6 provides negative feedback, selected not so much for linear amplification but for stability at the zero crossing points of the AC test input.

In its quiescent state, without application of a 120 VAC test signal, the output of the op-amp B remains high because the voltage divider (resistors R5 and R6) is of such ratio as to assure that the inverting input is always below the threshold provided by the DC reference signal at the other input of the op-amp B. When a positive half-cyele is applied to the AC Test terminal 20D, the inverting input voltage rises above the DC reference signal threshold and the output goes low ("off"). The op-amp C in the following stage is a simple logic inverter using the DC reference as a threshold. The output at V2 is then continuously low (near ground) when the test function is "off" and it is a pulse train of about forty percent duty cycle when it is "on".

While the form of the improved circuit status indicating device herein described constitutes a preferred embodiment of the invention, it is to be understood that the invention is not limited to this precise form, and that changes may be made therein without departing from the scope and spirit of the invention as defined in the appended claims.

The invention having thus been described, the following is claimed:

1. An improved circuit status indicating device for use in monitoring a circuit to indicate the on/off status of the circuit wherein said circuit conducts an alternating current (AC) operating signal when switched to "on" status and an AC non-operating signal when switched to "off" status, said AC non-operating signal being reduced to a fraction of, and is made out-of-phase with, said AC operating signal by conditioning effects of input circuitry intended to receive said signal, said circuit status indicating device comprising:
    indicating means operated from an "off" to "on" condition by a direct current (DC) signal and from the "on" to "off" condition by the absence of a DC signal;
    means for receiving and conditioning an AC input signal, said AC input signal corresponding to one of said AC operating and non-operating signals being conducted in the circuit being monitored;
    means for generating a modified AC reference signal;
    means for comparing said AC input signal with said modified AC reference signal and producing an AC comparison output signal, said AC comparison output signal being, after brief delay of some input cycle periods or fraction thereof, an AC output signal when said AC input signal corresponds to said AC operating signal or an AC output signal when said AC input signal corresponds to said AC non-operating signal;
    means for generating a DC reference signal to act as a threshold or switching point for said AC comparison output signal;
    means for comparing said AC comparison output signal with said DC reference signal and producing a DC output signal when said AC comparison output signal, after brief delay of some input cycle periods or fraction thereof, exceeds the predetermined level of said DC reference signal, said AC comparison output signal when corresponding to said first AC output signal being above said level of said DC reference signal or when corresponding to said second AC output signal being below said level of said DC reference signal; and
    means for receiving said DC output signal and operating said indicating means from said "off" to "on" condition, and from said "on" to "off" condition in absence of receipt of said DC output signal.

2. The device as define in claim 1, further comprising:
    means for comparing an AC test signal with said DC reference signal and producing a DC test output signal which exceeds the level of said DC reference signal;

said DC output signal receiving means receiving said DC test output signal and operating said indicating means from said "off" to "on" condition.

3. The device as defined in claim 1, wherein said indicating means includes at least one light emitting diode (LED).

4. The device as defined in claim 1, wherein said AC input signal receiving means includes a capacitor, diode and voltage divider network which receives said AC input signal and rectifies the same into positive half-cycles of an amplitude greater than corresponding half-cycles of said modified AC reference signal when said AC input signal corresponds to said AC operating signal of the monitored circuit, said network being operable to reduce the amplitude and shift the phase of said AC input signal with respect to said modified AC reference signal when said AC input signal corresponds to said AC non-operating signal.

5. The device as defined in claim 4, wherein said AC comparison output signal producing means includes an operational amplifier being connected to said network and to said modified AC reference signal generating means so as to compare said AC input signal after being operated on by said network with said modified AC reference signal and produce said AC comparison output signal.

6. The device as defined in claim 5, wherein said DC output signal producing means includes:
a resistor and capacitor network which receives the DC pulse train and converts it to ramping AC comparison output signal;
an operational amplifier connected to said network and to said DC reference signal generating means for receiving said DC reference signal; and
a hysteresis feedback resistor connected to said amplifier and said network such that said AC comparison output is at a level above said DC reference signal when, after brief delay of some input cycle periods or fraction thereof, it is said first AC output signal corresponding to said AC operating signal and below said DC reference signal when it is said second AC output signal corresponding to said AC non-operating signal.

7. The device as defined in claim 6, wherein said DC output signal receiving and operating means includes a current limiting resistor connected to the output of said operational amplifier.

8. The device as defined in claim 1, wherein said DC output signal producing means includes:
a resistor and capacitor network which receives said DC pulse train and converts it to ramping AC comparison output signal;
an operational amplifier connected to said network and to said DC reference signal generating means for receiving said DC reference signal; and
a hysteresis feedback resistor connected to said amplifier and said network such that said AC comparison output is at a level above said DC reference signal when, after brief delay of some input cycle periods or fraction thereof, it is said first AC output signal corresponding to said AC operating signal and below said DC reference signal when it is said second AC output signal corresponding to said AC non-operating signal.

9. The device as defined in claim 8, wherein said DC output signal receiving and operating means includes a current limiting resistor connected to the output of said operational amplifier.

10. The device as defined in claim 1, wherein said modifier AC reference signal generating means includes:
a diode and voltage divider network which receives and conditions an AC line signal; and
an operational amplifier connected with said network so as to operate alternately as a unity gain, non-inverting amplifier during positive half-cycles of said AC line signal and as a greater-than-unity gain, saturating amplifier during negative half-cycles of said AC line signal and produce said modified AC reference signal in the form of a series of positive square waves alternating with a series of positive sine waves.

11. The device as defined in claim 10, wherein said AC input signal receiving means includes a capacitor, diode and voltage divider network which receives said AC input signal and rectifies the same into positive half-cycles of an amplitude greater than corresponding half-cycles of said modified AC reference signal when said AC input signal corresponds to said AC operating signal of the monitored circuit; said network being operable to reduce the amplitude and shift the phase of said AC input signal with respect to said modified AC reference signal when said AC input signal corresponds to said AC non-operating signal.

12. The device as defined in claim 11, wherein said AC comparison output signal producing means includes an operational amplifier being connected to said network and to said modified AC reference signal generating means so as to compare said AC input signal after being operated on by said network with said modified AC reference signal and produce said AC comparison output signal.

13. The device as defined in claim 12, wherein said DC output signal producing means includes:
a resistor and capacitor network which receives said DC pulse train and converts it to ramping AC comparison output signal;
an operational amplifier connected to said network and to said DC reference signal generating means for receiving said DC reference signal; and
a hystersis feedback resistor connected to said amplifier and said network such that said AC comparison output is at a level above said DC reference signal when, after brief delay of some input cycle periods or fraction thereof, it is said first AC output signal corresponding to said AC operating signal and below said DC reference signal when it is said second AC output signal corresponding to said AC non-operating signal.

14. The device as defined in claim 13, wherein said DC output signal receiving and operating means includes a current limiting resistor connected to the output of said operational amplifier.

15. The device as defined in claim 1, wherein said DC reference signal generating means includes:
a voltage divider network which receives a DC supply voltage signal and produces said DC reference signal; and
an operational amplifier connected to said network so as to operate as a unity gain amplifier to buffer said DC reference signal and feed the same to said DC output signal producing means.

16. The device defined in claim 1; wherein
all op-amps operate in single-ended fashion as evidenced by their single power supply, input voltage range within the single supply range and output voltage range within the single supply range;

the input networks of the AC Reference, AC Input Detectors and AC Test Detector circuits all operate and condition in linear fashion only the positive half cycles of their respective AC inputs;

the input networks of the AC Reference, AC Input Detector and AC Test Detector circuits all operate on and condition their respective AC inputs in such non-linear fashion, as evidenced by their respective clamping diodes D1, D8 and D10, that effects of detection during negative half-cycle inputs are null;

because of the aforementioned deliberate design to avoid inconveninence of isolating AC input circuits from DC powered circuits by conventional means (e.g. transformers), the AC input circuits, external AC circuits from which the AC inputs are derived and DC powered circuits share the same common (e.g. ground or power return) and therefore these circuits are not isolated;

because of the aforementioned deliberate design to avoid inconvenience of bridge rectifiers for linear operation over the full input cycle, the AC input circuits each contain half wave rectification with a single diode per input circuit at non disadvantage to practical linear detection.

17. The device defined in claim 1; wherein the components R11, C5 and hysteresis feedback amplifier F constitute a pulse width detection method operating on the pulse train output of op-amp E, discretely consistent with the AC operating signal state, having various duty cycles so as to provide switched levels of LED on/off drive states, is uniquely applied here in an indication system to resolve the unusual problems inherent in the on/off states of triac/snubber-circuit configurations.

18. The device defined in claim 1; wherein the modified AC reference circuitry switches modes from non-inverting, unity gain to inverting, greater than unity gain on alternate half-cycles, thereby providing the unique ability of the following AC input detector to perform linear detection on positive half cycle inputs and ignore negative half cycle inputs with no degradation to detection of AC operating/non-operating discrete states as output in the form of a pulse train of varying but discrete duty cycle.

* * * * *